US011538956B2

(12) United States Patent
Ruf et al.

(10) Patent No.: US 11,538,956 B2
(45) Date of Patent: Dec. 27, 2022

(54) METHODS AND APPARATUS TO CONTROL ZONE TEMPERATURES OF A SOLAR CELL PRODUCTION SYSTEM

(71) Applicant: Illinois Tool Works Inc., Glenview, IL (US)

(72) Inventors: Daniel M. Ruf, Minneapolis, MN (US); Roy Ball, Austin, MN (US)

(73) Assignee: Illinois Tool Works Inc., Glenview, IL (US)

( * ) Notice: Subject to any disclaimer, the term of this patent is extended or adjusted under 35 U.S.C. 154(b) by 791 days.

(21) Appl. No.: 16/394,498

(22) Filed: Apr. 25, 2019

(65) Prior Publication Data

US 2019/0334053 A1    Oct. 31, 2019

Related U.S. Application Data

(60) Provisional application No. 62/663,458, filed on Apr. 27, 2018.

(51) Int. Cl.
| | | |
|---|---|---|
| *H01L 31/18* | (2006.01) | |
| *H05B 6/06* | (2006.01) | |
| *H01L 21/67* | (2006.01) | |
| *F27B 17/00* | (2006.01) | |

(52) U.S. Cl.
CPC .......... *H01L 31/1864* (2013.01); *F27B 17/00* (2013.01); *H01L 21/67109* (2013.01); *H05B 6/06* (2013.01)

(58) Field of Classification Search
CPC ........... H01L 31/1864; H01L 21/67109; H01L 21/67098; H01L 21/67115; H01L 21/67248; H01L 21/6776; F27B 17/00; H05B 6/06; H05B 3/0047; Y02E 10/50; Y02P 70/50

See application file for complete search history.

(56) References Cited

U.S. PATENT DOCUMENTS

| 7,317,175 B2 * | 1/2008 | Irwin ...................... B29C 51/46 |
| | | 219/385 |
| 7,805,064 B2 | 9/2010 | Ragay |
| 8,828,776 B2 | 9/2014 | Parks |

(Continued)

FOREIGN PATENT DOCUMENTS

| KR | 20180000882 | 1/2018 |
| WO | 2016187434 | 11/2016 |

OTHER PUBLICATIONS

Int'l Search Report and Written Opinion Appln No. PCT/US2019/029432 dated Aug. 13, 2019 (12 pgs.).

*Primary Examiner* — John P. Dulka
(74) *Attorney, Agent, or Firm* — McAndrews Held & Malloy, Ltd.

(57) ABSTRACT

Methods and apparatus to control zone temperatures in a solar cell production system are disclosed. An example furnace to fire photovoltaic cells includes: a plurality of zones comprising firing elements configured to fire a metallization layer of photovoltaic cells by heating the photovoltaic cells in the zones; one or more belts configured to transport photovoltaic cells through a sequence of the plurality of zones; a user interface comprising one or more input devices; and control circuitry configured to: control the firing elements for the plurality of zones; and modify a configuration of two or more of the plurality of zones based on input received via the input device.

11 Claims, 7 Drawing Sheets

(56) References Cited

U.S. PATENT DOCUMENTS

| | | | |
|---|---|---|---|
| 9,246,044 B2 * | 1/2016 | Szlufcik | H01L 31/02245 |
| 2008/0012499 A1 * | 1/2008 | Ragay | H01L 21/67109 |
| | | | 315/113 |
| 2009/0101199 A1 * | 4/2009 | Carroll | H01L 31/022425 |
| | | | 252/514 |
| 2009/0298283 A1 * | 12/2009 | Akimoto | H01L 31/022425 |
| | | | 257/E31.124 |
| 2012/0060758 A1 | 3/2012 | Feldman-Peabody | |
| 2017/0098837 A1 * | 4/2017 | Nandjou Dongmeza | H01M 8/04574 |
| 2017/0301804 A1 * | 10/2017 | Hang | B23K 35/025 |

* cited by examiner

METHODS AND APPARATUS TO CONTROL ZONE TEMPERATURES OF A SOLAR CELL PRODUCTION SYSTEM

BACKGROUND

This disclosure relates to solar cell production and, more particularly, to methods and apparatus to control zone temperatures in a solar cell production system.

Photovoltaic cell production involves multiple steps, including depositing the materials and firing the deposited materials in a furnace. The properties of certain types of photovoltaic cells are closely related to the firing temperature of the photovoltaic cells. The firing step is typically the final step in the production process, and also has a substantial effect on the performance of the finished photovoltaic cell.

SUMMARY

Methods and apparatus to provide closed loop control in a solar cell production system are disclosed, substantially as illustrated by and described in connection with at least one of the figures, as set forth more completely in the claims.

DRAWINGS

These and other features, aspects, and advantages of the present disclosure will become better understood when the following detailed description is read with reference to the accompanying drawings in which like characters represent like parts throughout the drawings, wherein.

The figures are not necessarily to scale. Where appropriate, similar or identical reference numbers are used to refer to similar or identical components.

DETAILED DESCRIPTION

The terms "photovoltaic cell," "solar cell," and "wafers" are used interchangeably throughout this patent.

Disclosed example furnaces to fire photovoltaic cells include: a plurality of zones comprising firing elements configured to fire a metallization layer of photovoltaic cells by heating the photovoltaic cells in the zones; one or more belts configured to transport photovoltaic cells through a sequence of the plurality of zones; a user interface comprising one or more input devices; and control circuitry configured to: control the firing elements for the plurality of zones; and modify a configuration of two or more of the plurality of zones based on input received via the input device.

In some examples, the user interface enables a selection of ones of the plurality of zones for inclusion in the subset. In some examples, the user interface enables a selection of a predetermined subset of the plurality of zones as the subset. In some examples, the user interface enables selection and deselection of individual ones of the plurality of zones for inclusion in the subset.

In some example furnaces, the control circuitry is configured to, in response to receiving an input via the user interface, increment or decrement a respective temperature setpoint for each of the plurality of zones included in the subset. In some examples, the control circuitry is configured to select the subset of the plurality of zones and increment or decrement a respective temperature setpoint for each of the plurality of zones included in the subset based on a single input from the user interface.

In some examples, first ones of the plurality of zones are located on a first side of the one or more belts and second ones of the plurality of zones are located on a second side of the one or more belts. In some examples, the control circuitry is configured to receive a peak cell temperature via the one or more input devices and modify the configuration of the two or more of the plurality of zones to achieve the peak cell temperature.

In some example furnaces, the user interface includes at least one of a hardware button, a software button, a display screen and cursor, or a touchscreen. In some examples, the plurality of zones correspond to respective volumes within a heating section of the furnace. In some examples, the user interface is configured to indicate which of the plurality of zones is currently included in the subset. In some examples, the user interface is configured to indicate at least one of a current temperature or a temperature setpoint for each of the plurality of zones.

Figure 1:
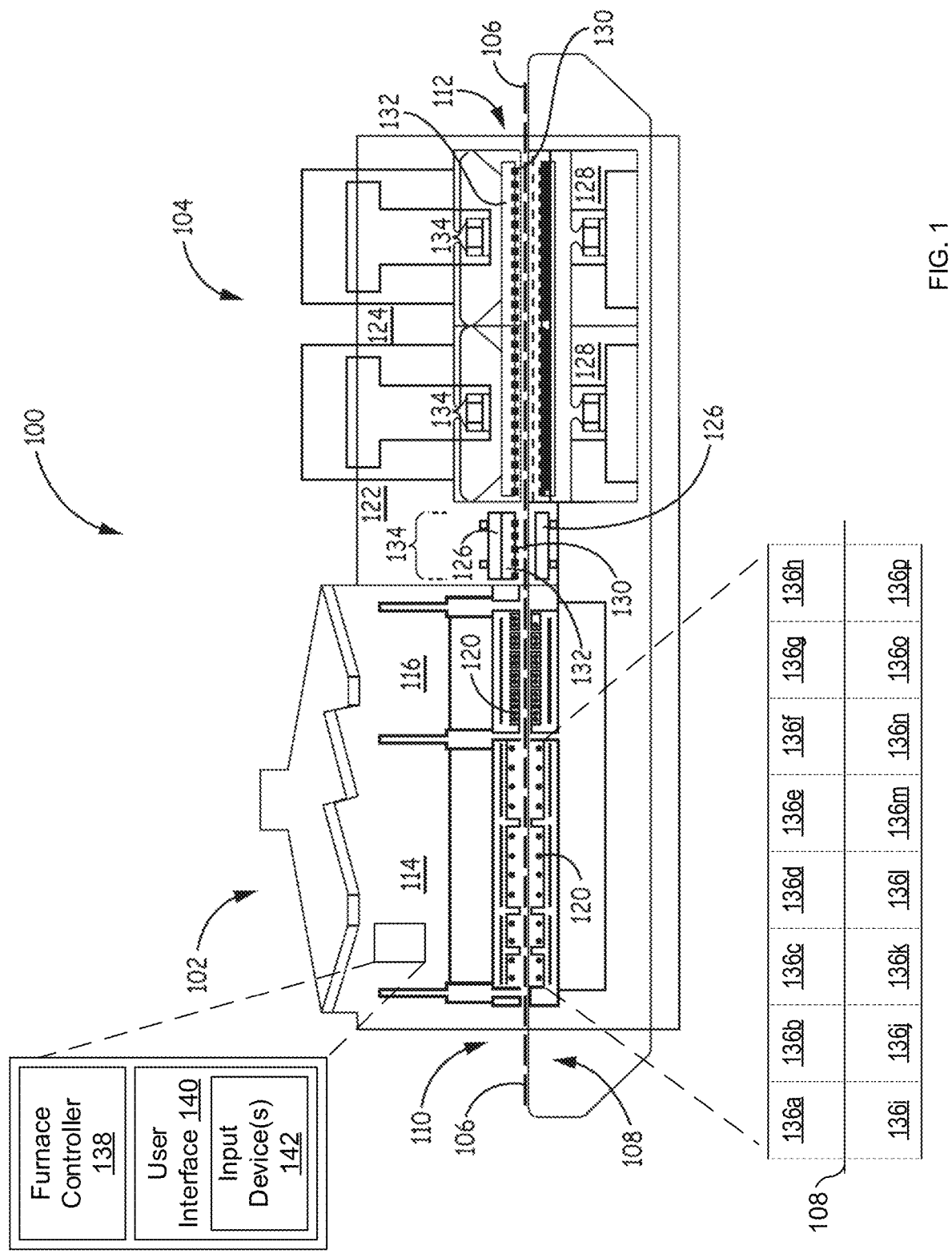
FIG. 1 is a side plan view of an example of photovoltaic cell firing furnace, in accordance with aspects of this disclosure.

FIG. 1 is a side plan view of an example firing furnace 100 having a heating chamber 102 and a cooling chamber 104, where light annealing is integrated into the cooling chamber 104 but not the heating chamber 102.

The furnace 100 shown in FIG. 1 is suitable for use in the firing of metal contacts on photovoltaic devices (such as solar cells) 106. Wafers of photovoltaic cells (also referred to herein as "wafers" or "solar cells") 106 are transported by a conveyor 108 (e.g., a belt) into an entry 110 formed in the firing furnace 100. After processing, the wafers 106 are transported by the conveyor 108 out of an exit 112 formed in the firing furnace 100. More specifically, in the exemplary embodiment shown in FIG. 1, wafers 106 pass through the entry 110 into the heating chamber 102, then pass through the heating chamber 102 and the cooling chamber 104, and then are conveyed out of the furnace 100 through the exit 112.

Although the following description refers to a single conveyor 108 for ease of explanation, it is to be understood that one, two, or more parallel conveyors 108 can be used at the same time in the same furnace 100. Each separate conveyor 108 is also referred to as a "lane." In one implementation, the furnace 100 and the conveyor 108 are configured so that each conveyor 108 (and the solar cells 106 thereon) are thermally isolated from one another in order to reduce lane-to-lane influence.

As noted above, the furnace 100 is used for the firing of metal contacts on photovoltaic cells 106. Front and back side metal contacts of photovoltaic cells 106 are initially formed by an electrically conductive metallized paste or ink that is applied, for example, by a screen printing, inkjet spray or aerosol spray process to silicon wafers. Commonly, the front side contact extends in a grid pattern, and the backside contact extends continuously.

After the metallized paste has been applied to the silicon wafers 106, the wafers 106 are dried. The wafers 106 are dried in order to remove any remaining volatile organic compounds (VOCs) (for example, solvent) used in the screen-printing or other paste-application processes.

In the exemplary embodiment shown in FIG. 1, the solvent removal is decoupled from binder burnout to improve binder retention. This is done by drying the silicon wafers 106 in a heating chamber that is separate from the heating chamber in which the binder burnout is performed. In one example, this is done by using a separate drying furnace (such as a continuous infrared drying furnace) (not shown in FIG. 1) that feeds into the firing furnace 100 shown in FIG. 1. In an alternative example, the drying furnace is integrated with the firing furnace 100.

In the example of FIG. 1, the first heating section 114 is configured for binder burn out (and is also referred to here as the "binder-burn-out heating section" 114). In this exemplary embodiment, the second heating section 116 is configured for firing the metallization layers of the solar cells 106 (and is also referred to here as the "metallization heating section" 116). The furnace 100 is configured to thermally decouple the binder-burn-out heating section 114 from the metallization heating section 116 so that each section 114 and 116 can be independently controlled and optimized for each of the respective process objectives.

Exhaust ducts are used to thermally decouple each of the heating sections 114 and 116 from each other and from the exterior environment in the case of the binder-burn-out heating section 114 and from the cooling chamber 104 in the case of the metallization heating section 116. The exhaust ducts are also used to vent out of the furnace 100 any off-gases produced while the wafers 106 pass through the furnace 100.

Each example section 114 and 116 includes multiple pairs of infrared (IR) lamps 120, where one "upper" IR lamp 120 of each pair is located above the conveyor 108 and the other "lower" IR lamp 120 of each pair is located below the conveyor 108 directly opposite the corresponding upper IR lamp 120.

In some examples, the upper and lower IR lamps 120 can be separately controlled in order to provide independent control and optimization of conditions in the top and bottom regions of the heating sections 114 and 116 (for example, because different metal pastes are used on the top and bottom surfaces of the solar cells 106).

In the example of FIG. 1, the heating chamber 102 includes two heating sections 114 and 116, where each of the sections 114 and 116 can be independently controlled (for binder burn out in the case of the section 114 and for firing the metallization layer in the case of section 116). However, the heating chamber 102 may be configured to have a different number of sections. Also, one or more of the sections of the heating chamber 102 can be further subdivided into smaller zones or microzones, where each such zone or microzone can be independently controlled to provide additional control over the heating in the heating chamber 102.

The example cooling chamber 104 of FIG. 1 includes two cooling sections 122 and 124. However, a different number of cooling sections may be used. In some examples, the cooling chamber 104 is omitted entirely and/or is implemented as a separate system from the heating chamber 102.

The first cooling section 122 uses radiant cooling to cool wafers 106 that pass through the first cooling section 122, and the second cooling section 124 uses convection cooling to cool wafers 106 that pass through the second cooling section 124. The first cooling section 122 is also referred to here as the "radiant" cooling section 122, and the second cooling section 124 is also referred to here as the "convective" cooling section 124.

The radiant cooling section 122 includes a pair of cooling walls 126. One of the cooling walls 126 is positioned above the conveyor 108, and the other one of the cooling walls 126 is positioned below the conveyor 108. In the example of FIG. 1, the cooling walls 126 are water-cooled. Cooled water is circulated through pipes (or other passages) that are in thermal contact with the cooling walls 126. Other techniques for radiant cooling may be used.

The silicon wafers 106 that exit the heating chamber 102 and pass through the radiant cooling section 122 are cooled by radiant heat transfer from the wafers 106 to the cooling walls 126 and the water flowing through the pipes.

The example convective cooling section 124 includes two sub-sections 128. Each of the convective cooling sub-sections 128 includes one or more supply fans that draw air into the upper part of that cooling sub-section 128 and causes the air to flow down towards the conveyor 108 and to pass the wafers 106. The supply air may be sourced from a recirculation duct or from one or more air intakes. Some of the air contacts the surface of the passing wafers 106 as it flows downward, thereby heating the flowing air. The air then flows below the conveyor 108 and the passing wafers 106. Each convective cooling sub-section 128 also includes one or more exhaust fans that draw the flowing air away from the wafers 106. The exhaust fans may expel the air into the environment, to a filter or oxidizer, and/or to a return duct for recirculation of the air back to supply ducts.

A respective heat exchanger is positioned in each sub-section 128 below the conveyor 108. Air flowing over and around the passing wafers 106 is heated. Heat from the air flowing past the heat exchanger is transferred to the heat exchanger. This cools the air before it is drawn into the return duct and re-circulated into the upper part of the corresponding sub-section 128.

The heating and cooling chambers 102 and 104 shown in FIG. 1 are merely exemplary. The heating and cooling chambers 102 and 104 can be implemented in other ways. For example, the cooling chamber 104 may be omitted, and the wafers 106 cooled via convection after exiting the heating chamber 102.

One or more sections 122 and 124 of the cooling chamber 104 may include lights 130 for performing light annealing of the solar cell wafers 106 passing through the cooling chamber 104.

The purpose of light annealing is to reduce the effect of light induced degradation (LID) that occurs in the solar cells 106. Traditionally, this light anneal has involved exposing completed solar cells to intense light at an elevated temperature in a separate, standalone process where the intense illumination occurs, at least in part, in a heating chamber of a furnace.

However, with the furnace 100 described here in connection with FIG. 1, light annealing to reduce the effects of LID is integrated into the cooling chamber 104 of the furnace 100. Light annealing is not performed in the heating chamber 102 of the furnace 100. Instead, residual heat from the heating chamber 102 is used to achieve the required elevated temperature for light annealing in the cooling sections 122 and 124 of the cooling chamber 104. In the example of FIG.

1, a hydrogen source is not present in the cooling chamber 104; instead, light annealing is performed in ambient air.

In the example of FIG. 1, an array of lights 130 is positioned in both the radiant cooling section 122 and the convective cooling section 124 of the cooling chamber 104, but not in the heating chamber 102.

For each of the cooling sections 122 and 124, the example lights 130 include light emitting diodes (LEDs) that are mounted on a water-cooled plate 132. Cooled water is circulated through pipes (or other passages) that are in thermal contact with the plate 132. The plate 132 is water cooled in order to remove heat generated by the LEDs 130 and any heat that is transferred to the LEDs 130 and plates 132 by the passing solar cells 106.

In the exemplary embodiment shown in FIG. 1, one plate 132 with LEDs 130 mounted to it is positioned within the radiant cooling section 122, and another plate 132 with LEDs 130 mounted to it is positioned with the convective cooling section 124. However, it is to be understood multiple plates 132 with LEDs 130 mounted to them can be positioned within the radiant cooling section 122 or the convective cooling section 124. Also, a single plate 132 with LEDs 130 mounted to it can be used in both the radiant cooling section 122 and the convective cooling section 124. That is, the single plate 132 with LEDs 130 mounted to it can span the radiant cooling section 122 and the convective cooling section 124.

In the radiant cooling section 122, the respective water-cooled plate 132 (with the LEDs 130 mounted to it) is positioned between the upper cooling wall 126 and the conveyor 108 with the light output from the LEDs 130 directed generally downward towards the upper surface of the solar cells 106 passing by on the conveyor 108.

In the convective cooling section 124, the respective water-cooled plate 132 (with the LEDs 130 mounted to it) is positioned in the upper part of the section 124 above the conveyor 108 with the light output from the LEDs 130 directed generally downward towards the upper surface of the solar cells 106 passing by on the conveyor 108. The portion of the water-cooled plate 132 that is positioned in the convective cooling section 124 has a shape (and/or openings formed in it) to enable air flowing through the convective cooling section 124 to pass through and/or around the water-cooled plate 132 and the mounted LEDs 130.

The water-cooled plate 132 can be mounted within the cooling sections 122 and 124 in any suitable manner (for example by attaching, suspending, or supporting the plate 132 and LEDs 130 to one or more of the side, top, or bottom walls of the furnace 100 or one or more structures within the cooling chamber 104 such as the cooling walls 126).

A power supply (not shown) is electrically connected to each of the LEDs 130 in order to provide power to the LEDs 130. In this exemplary embodiment, the power supply is positioned outside of the cooling chamber 104.

The number, size, and arrangement of the LEDs 130 in the array are configured so as to provide sufficiently intense illumination for performing light annealing to reduce LID (for example, by having a radiation intensity in a range between 3,000 Watts/meters$^2$ and 48,000 Watts/meters$^2$). For example, in one implementation, 10 millimeter by 10 millimeter LEDs are arranged in an array in which there are at least two thousand LEDs in an area that is about 0.3 meters wide by about 3 meters long. It is to be understood, however, that the LEDs can be arranged in other ways.

In this exemplary embodiment, the LEDs 130 are commercially available LEDs that output light in the spectrum between 300 nanometers and 900 nanometers (that is, within the visible spectrum).

Moreover, one advantage of using LEDs 130 to provide the intense light for light annealing is that the intensity of light output from the LEDs 130 can be adjusted by adjusting the DC voltage supplied to the LEDs 130. This enables the light intensity to be adjusted as needed to optimize the light annealing process.

In the example of FIG. 1, the array of LEDs 130 includes multiple zones 134, where each zone 134 includes a subset of the LEDs 130. In this exemplary embodiment, the intensity of light output by the LEDs 130 in each of the zones 134 can be independently controlled. The zones 134 can be adjusted so that the intensity of light output by the LEDs 130 in at least one of the zones 134 differs from the intensity of light output by the LEDs 130 in at least one of the other zones 134. For example, the temperature of the solar cells 106 will be reduced as the solar cells 106 are conveyed through the cooling chamber 104. As a result, it might be beneficial to adjust the light intensity in the various zones 134 to account for this reduction in temperature as the solar cells are conveyed through the cooling chamber 104.

In general, the process of light annealing for LID reduction can be controlled based on various factors including, without limitation, the speed at which the solar cells 106 are conveyed through the cooling chamber 104, the length of the cooling chamber 104, the length of the array of LEDs 130, the exit temperature of the solar cells 106 as they exit the heating chamber 102 and enter the cooling chamber 104, the intensity of light output from the LEDs 130 in each of the light zones 134 (or the array of LEDs 130 as a whole where zones 134 are not used), and the number, size, and arrangement of the LEDs 130.

In some examples, the LEDs 130 are omitted from the furnace 100, and annealing is instead implemented at a different location in the manufacturing process.

In some examples, one or more of these factors are controlled so that each solar cell 106 moving through the cooling sections 122 and 124 on the conveyor 108 will be exposed to the intense light from the LEDs 130 for an amount of time between 5 seconds and 45 seconds. In one example, this is done while each solar cell 106 is at a temperature between 700° C. and 240° C. In another example, this is done while each solar cell 106 is at a temperature between 700° C. and 50° C.

The first heating section 114 includes a number of heating zones 136a-136p above and below the conveyor 108. The example heating zones 136a-136p correspond to respective volumes within the first heating section 114, and are individually controlled by the example furnace controller 138 by controlling the lamps 120 associated with the corresponding heating zone 136a-136p. While the example heating zones 136a-136p are illustrated as eight adjacent upper zones 136a-136h and eight adjacent lower zones 136i-136p in FIG. 1, any number and/or arrangement of heating zones may be implemented in the first heating section 114 and/or the second heating section 116. In some examples, one or more of the adjacent heating zones are separated by space that is devoid of heating lamps 120 and/or separated by one or more baffles or other barriers to inhibit transfer of heat between the zones 136a-136p.

The example furnace 100 may include a furnace controller 138 and a user interface 140 to enable a user of the furnace to control, among other things, the temperatures within the zones 136a-136p and/or the belt speed. The example furnace controller 138 may include control circuitry, a general purpose or special purpose (e.g., integrated) computing device, and/or any other type of controller.

The example controller 138 may use heating profiles that define respective temperatures for the heating zones 136a-136p in the furnace 100. The furnace controller 138 may store, load, modify, and/or otherwise use the heating profiles to quickly define the temperatures to be used by the furnace 100. To control the temperatures of the zones 136a-136p, the furnace controller 138 controls heating elements, such as infrared lamps, corresponding to each of the example zones 136a-136p. While an example lane including the sixteen zones 136a-136p is illustrated in FIG. 1, the example controller 138 may control any number of zones corresponding to any number of lanes (e.g., 2 or more).

The example user interface 140 includes one or more input device(s) 142, which may be used to set the temperatures of the zones 136a-136p to be used by the furnace controller 138. Due to the large number of zones, changes involving making individual adjustments to multiple zone temperatures may be time-consuming. The example furnace controller 138 and the user interface 140 enable a user to modify a configuration of multiple zones 136a-136p based on input received via the input device, substantially faster than making the same configuration modifications to the zones 136a-136p individually. The example user interface 140 may be implemented using hardware buttons and/or devices, software buttons (e.g., via a touchscreen or cursor input), and/or any combination of hardware and/or software.

Figure 2A:
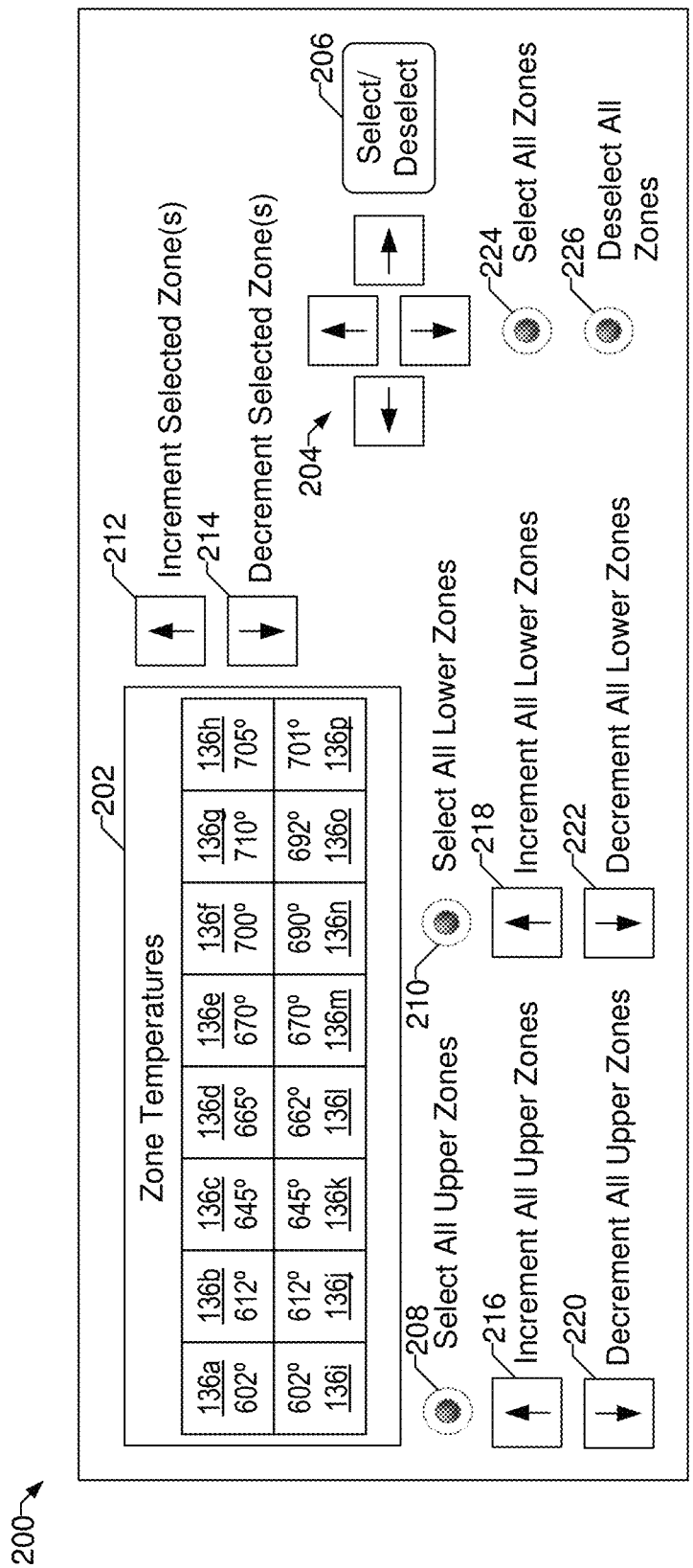
FIG. 2A illustrates an example user interface that may be used to implement the user interface of FIG. 1.

FIG. 2A illustrates an example user interface 200 that may be used to implement the user interface 140 of FIG. 1. The example user interface 200 includes a display 202 and input devices 204-226 to modify configurations (e.g., temperature settings) for the zones 136a-136p. The example display 202 displays current temperature settings for each of the example zones 136a-136p and/or an indication of which of the zones 136a-136p are selected at a given time.

The user interface 200 includes zone selection buttons, including zone navigation buttons 204, a zone selection/deselection button 206, and zone group selection buttons 208, 210, 224, 226. The operator may use the zone navigation buttons 204 to navigate (e.g., a cursor or other indicator) to one or more of the zones on the display 202. Once highlighted, the operator may select the zone selection/deselection button 206 to select the highlighted zone(s) (e.g., to add the zone(s) to the subset of zones if not yet included in the subset) and/or to deselect the highlighted zone(s) (e.g., to remove the zone(s) to the subset of zones if not yet included in the subset).

Additionally or alternatively, an operator may use the upper zone group selection button 208 to select all of the upper zones 136a-136h with a single input. Similarly, an operator may use the lower zone group selection button 210 to select all of the lower zones 136a-136h with a single input. A total group selection button 224 enables a user to quickly select all of the zones 136a-136p, and a total group deselection button 226 enables the user to quickly deselect all of the zones 136a-136p. While example zone groups are described with reference to the zone group selection buttons 208, 210, 224, 226, other groups of zones may be used. Additionally or alternatively, custom zone groups may be created and/or assigned to particular buttons (or other input devices) for selection by an operator.

Figure 2B:
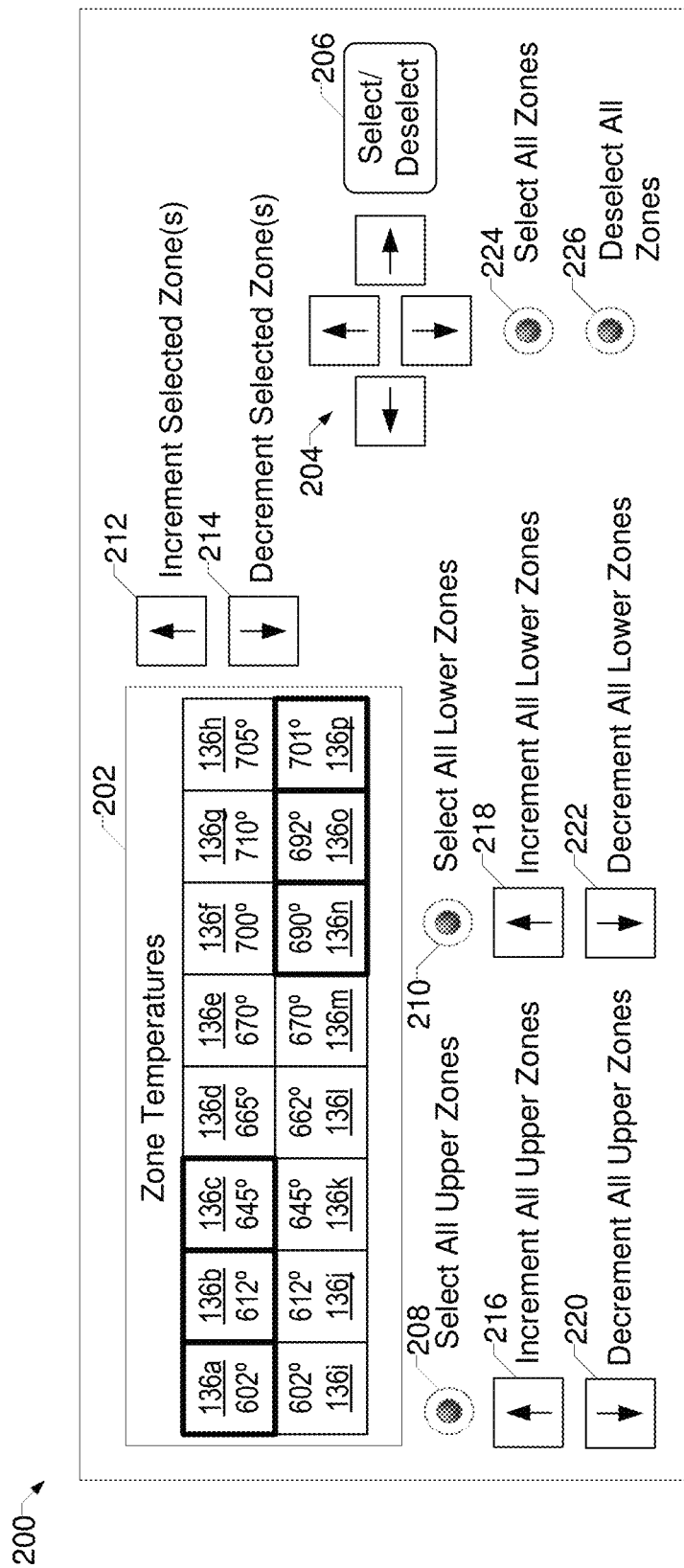
FIG. 2B illustrates the example user interface of FIG. 2A following selection of a subset of the zones.

FIG. 2B illustrates the example user interface 200 of FIG. 2A following selection of a subset of the zones 136a-136p. In the example of FIG. 2B, the example zones 136a, 136b, 136c, 136n, 136o, and 136p are included in a selected subset of zones. For example, the zones 136a, 136b, 136c, 136n, 136o, and 136p may have been selected by navigating to each of the zones 136a, 136b, 136c, 136n, 136o, and 136p using the zone navigation buttons 204 and, while each zone is highlighted, selecting (e.g., adding the zone to the subset) by selecting the zone selection/deselection button 206. Additionally or alternatively, one or more of the zones 136d-136m may have been removed from the subset using the zone navigation buttons 204 and the zone selection/deselection button 206.

Figure 2C:
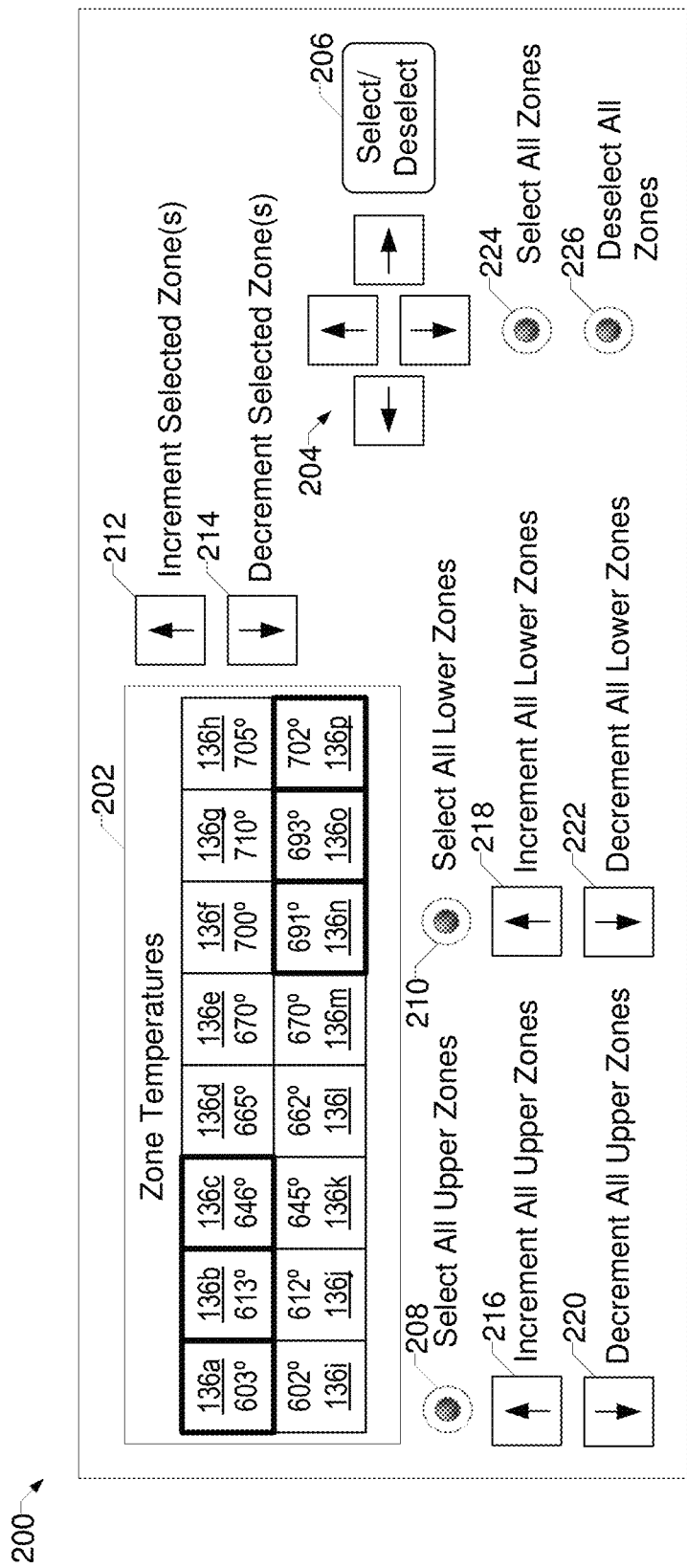
FIG. 2C illustrates the example user interface of FIG. 2A following a selection of incrementing the selected subset of the zones illustrated in FIG. 2B.

FIG. 2C illustrates the example user interface 200 of FIG. 2A following a selection of incrementing the selected subset of the zones 136a-136p illustrated in FIG. 2B. Each of the zones 136a, 136b, 136c, 136n, 136o, and 136p in the subset has been incremented 1 degree in response to selection of the zone increment button 212. Similarly, the temperature configuration for the subset of the zones 136a, 136b, 136c, 136n, 136o, and 136p may be decremented in response to selection of the zone decrement button 214.

Figure 2D:
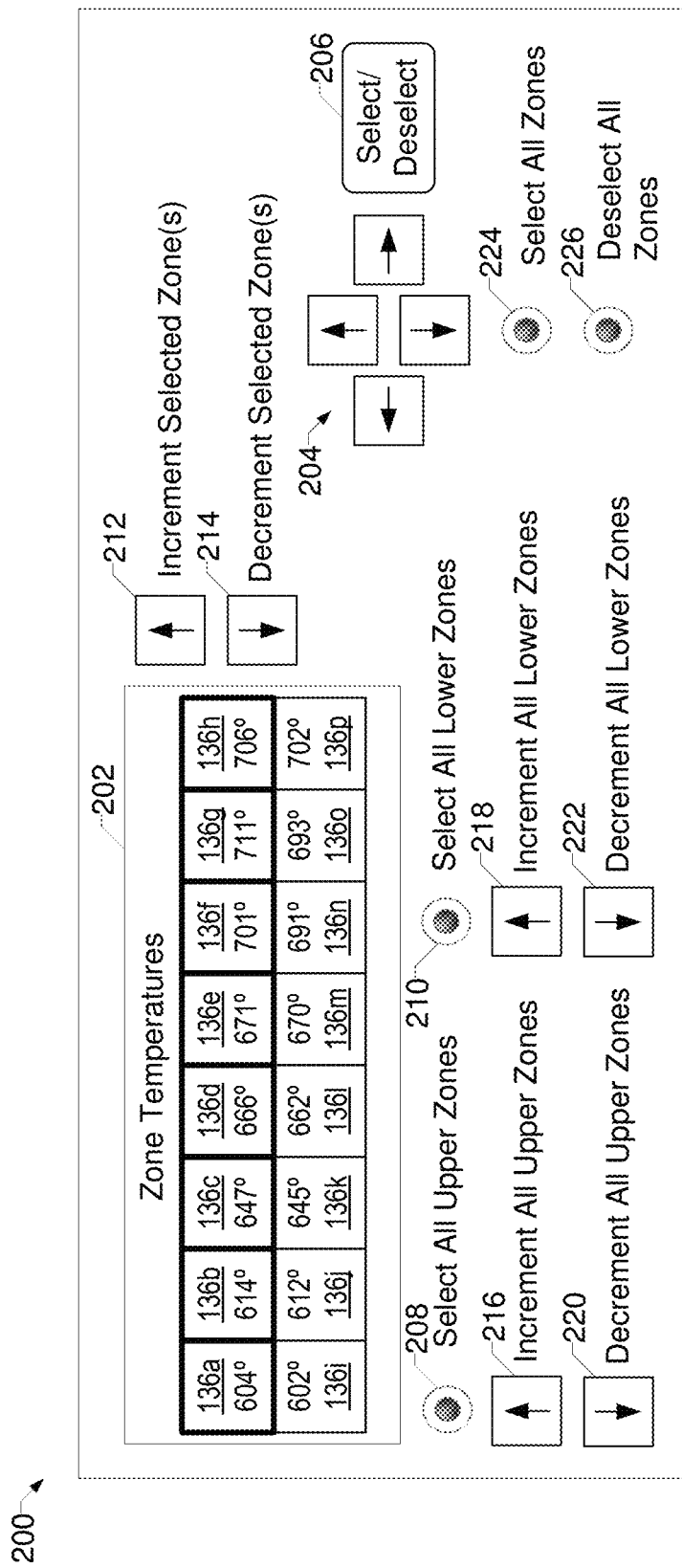
FIG. 2D illustrates the example user interface of FIG. 2A following a selection and incrementing of a subset of the zones illustrated in FIG. 2C.

FIG. 2D illustrates the example user interface 200 of FIG. 2A following a selection and incrementing of a subset of the zones 136a-136p illustrated in FIG. 2C. The example user interface 200 includes group configuration buttons 216-222. When selected, the group configuration buttons 216-222 select a predetermined subset of the zones 136a-136p assigned to the button 216-222 and modify the configuration of the subset of the zones 136a-136p. For example, an increment upper zones button 216 selects the zones 136a-136h as the subset (e.g., removing any other previously selected zones from the subset) and increments the zones 136a-136h. Similarly, the increment lower zones button 218 selects the zones 136i-136p as the subset (e.g., removing any other previously selected zones from the subset) and increments the zones 136i-136p. The decrement upper zones button 220 and the decrement lower zones button 222 have similar functions as the increment upper zones button 216 and increment lower zones button 218, respectively, with the exception of decrementing instead of incrementing.

The example group configuration buttons 216-222 may be customized for other subsets of the zones 136a-136p and/or other configuration actions (e.g., incrementing or decrementing by two or more degrees, etc.). FIG. 2D illustrates the user interface 200 following selection of the increment upper zones button 216 (e.g., following the modification to the zones 136a, 136b, 136c, 136n, 136o, and 136p illustrated in FIG. 2C.

Individual zone configuration (e.g., incrementing a zone temperature) for a conventional dual-lane furnace, each lane including 16 zones, and each zone configuration requiring zone selection and a three-digit zone, can require the user to enter more than 96 entries (e.g., button presses). In contrast, the same zone configuration using the example interface 200 may be accomplished in as few as two entries (e.g., group zone selection of all zones via button 224 and incrementing all selected zones via button 212).

In some examples, the furnace controller 138 receives a peak cell temperature via the interface 200 (e.g., a numeric input), and the furnace controller 138 modifies the configuration of the zones 136a-136p (e.g., the temperatures of the zones e136a-136p) to achieve the peak cell temperature. As an example, entry of a peak temperature of 780° C. in the interface 200 may cause the furnace controller 138 to configure the zones 136a-136p using the temperatures shown in Table 1 below:

TABLE 1

Example Zone Temperatures for a
Peak Cell Temperature of 780° C.

| Zone  | 136a | 136b | 136c | 136d | 136e | 136f | 136g | 136h |
|-------|------|------|------|------|------|------|------|------|
| Temp. | 600  | 600  | 600  | 700  | 700  | 750  | 800  | 800  |
| Zone  | 136i | 136j | 136k | 136l | 136m | 136n | 136o | 136p |
| Temp. | 600  | 600  | 600  | 700  | 700  | 750  | 800  | 800  |

The furnace controller 138 may determine the cell configurations from the peak temperature based on one or more of belt speed (e.g., cell dwell time), types of materials being fired (e.g., type of silver paste on a front of the photovoltaic cells 106, a type of aluminum paste on a back of the photovoltaic cells 106, or any other material), a type of silicon wafer used in the photovoltaic cells 106 (e.g., mono crystalline, multi crystalline), a sheet resistance of the wafer, a composition of a passivation layer, a cell architecture (e.g., standard, passivated emitter and rear cell (PERC)), paste printing metrics (e.g., line width and/or height, double printing, etc.). However, any other relevant parameter may be used in addition or as an alternative to the example parameters.

Figure 3:
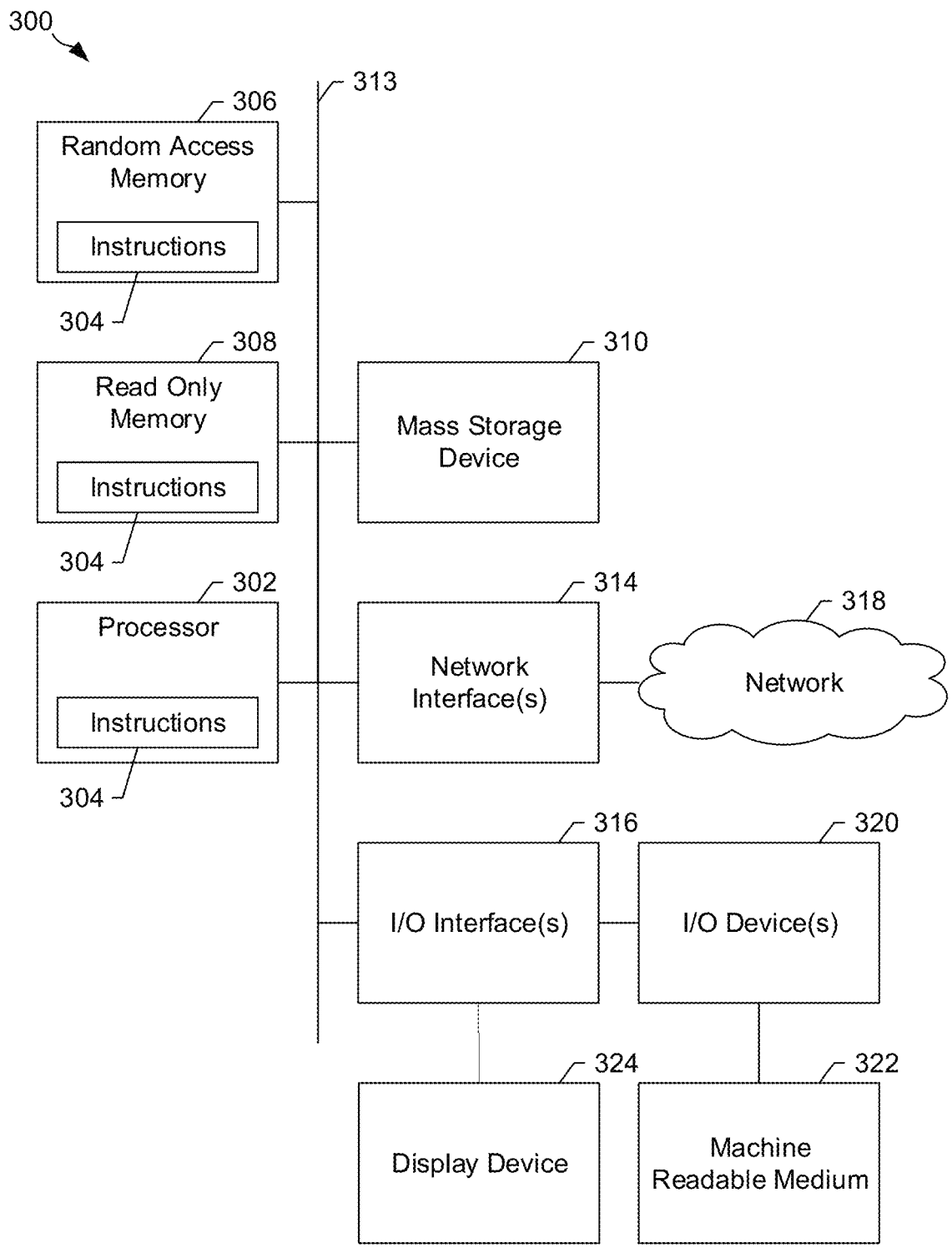
FIG. 3 is a block diagram of an example computing system that may be used to implement the furnace controller of FIG. 1.

FIG. 3 is a block diagram of an example computing system 300 that may be used to implement the furnace controller 138 of FIG. 1. The computing system 300 may be, an integrated computing device in the photovoltaic cell firing furnace 100, a desktop or all-in-one computer, a server, a laptop or other portable computer, a tablet computing device, a smartphone, and/or any other type of computing device.

The example computing system 300 of FIG. 3 includes a processor 302. The example processor 302 may be any general purpose central processing unit (CPU) from any manufacturer. In some other examples, the processor 302 may include one or more specialized processing units, such as RISC processors with an ARM core, graphic processing units, digital signal processors, and/or system-on-chips (SoC). The processor 302 executes machine readable instructions 304 that may be stored locally at the processor (e.g., in an included cache or SoC), in a random access memory 306 (or other volatile memory), in a read only memory 308 (or other non-volatile memory such as FLASH memory), and/or in a mass storage device 310. The example mass storage device 310 may be a hard drive, a solid state storage drive, a hybrid drive, a RAID array, and/or any other mass data storage device.

A bus 312 enables communications between the processor 302, the RAM 306, the ROM 308, the mass storage device 310, a network interface 314, and/or an input/output interface 316.

The example network interface 314 includes hardware, firmware, and/or software to connect the computing system 300 to a communications network 318 such as the Internet. For example, the network interface 314 may include IEEE 802.X-compliant wireless and/or wired communications hardware for transmitting and/or receiving communications.

The example I/O interface 316 of FIG. 3 includes hardware, firmware, and/or software to connect one or more input/output devices 320 to the processor 302 for providing input to the processor 302 and/or providing output from the processor 302. For example, the I/O interface 316 may include a graphics processing unit for interfacing with a display device, a universal serial bus port for interfacing with one or more USB-compliant devices, a FireWire® interface, a field bus, and/or any other type of interface. The example computing system 300 includes a display device 324 (e.g., an LCD screen) coupled to the I/O interface 316. Other example I/O device(s) 320 may include a keyboard, a keypad, a mouse, a trackball, a pointing device, a microphone, an audio speaker, an optical media drive, a multi-touch touch screen, a gesture recognition interface, a magnetic media drive, and/or any other type of input and/or output device.

The example computing system 300 may access a non-transitory machine readable medium 322 via the I/O interface 316 and/or the I/O device(s) 320. Examples of the machine readable medium 322 of FIG. 3 include optical discs (e.g., compact discs (CDs), digital versatile/video discs (DVDs), Blu-ray discs, etc.), magnetic media (e.g., floppy disks), portable storage media (e.g., portable flash drives, secure digital (SD) cards, etc.), and/or any other type of removable and/or installed machine readable media.

Figure 4:
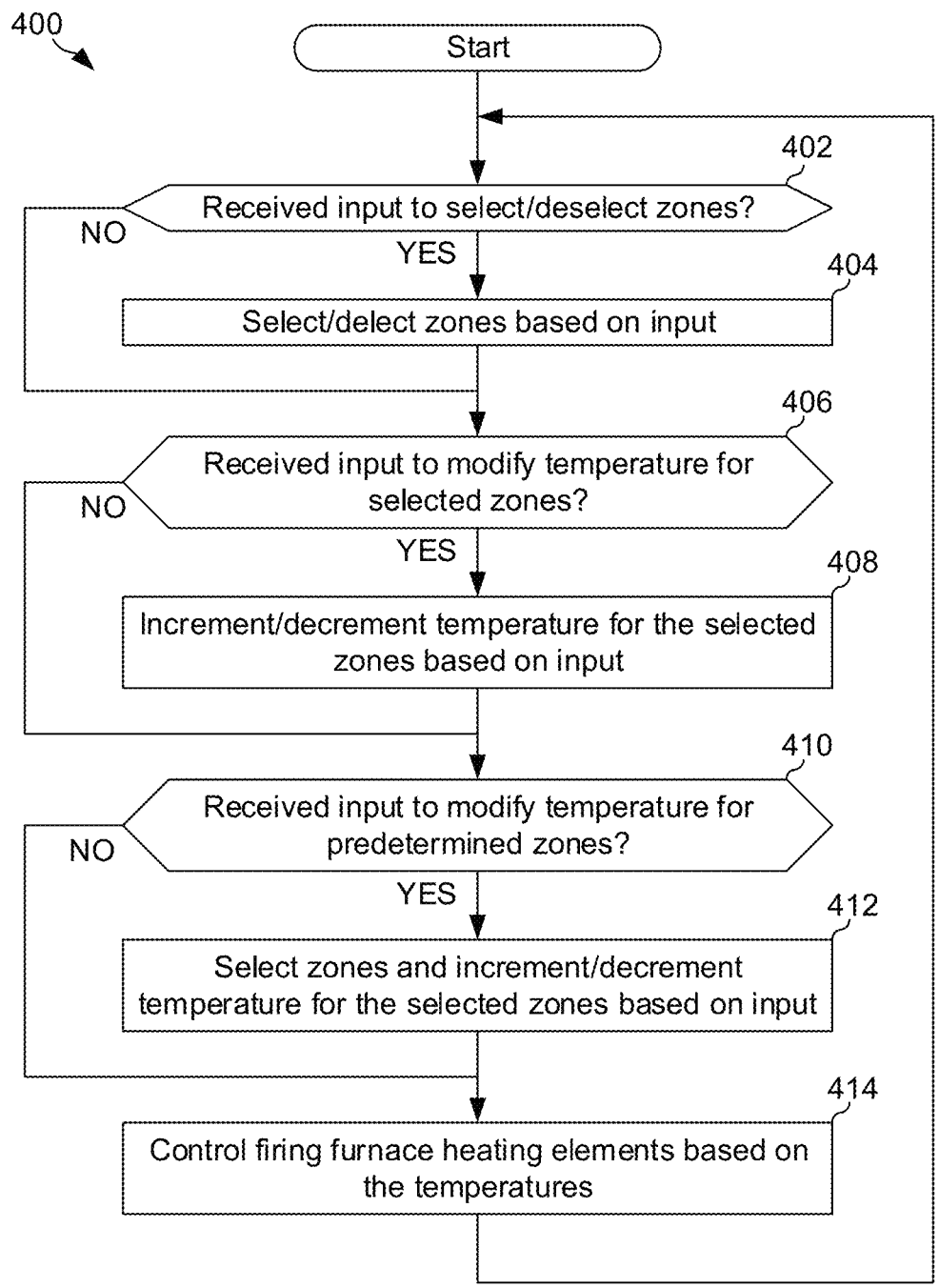
FIG. 4 is a flowchart representative of example machine readable instructions which may be executed by the example furnace controller of FIG. 1 to configure zone temperatures for a photovoltaic cell firing furnace.

FIG. 4 is a flowchart representative of example machine readable instructions 400 which may be executed by the example furnace controller 138 of FIG. 1 to configure zone temperatures for a photovoltaic cell firing furnace.

At block 402, the furnace controller 138 (e.g., control circuitry, a processor, etc.) determines whether input has been received to select and/or deselect zones for inclusion in a subset of temperature zones of the furnace 100. For example, the furnace controller 138 may monitor for inputs from the zone navigation buttons 204, the zone selection/deselection button 206, the zone group selection buttons 208, 210, 224, 226. If input has been received to select and/or deselect zones (block 402), at block 404 the furnace controller 138 selects and/or deselects one or more zones 136a-136p based on the received input.

After selecting and/or deselecting zones (block 404), or if input has not been received to select and/or deselect zones (block 402), at block 406 the furnace controller 138 determines whether input to modify temperature for the selected zones has been received. For example, the furnace controller 138 may monitor for inputs from the zone increment button 212 and/or the zone decrement button 214. If input to modify temperature for the selected zones has been received (block 406), at block 408 the furnace controller 138 increments or decrements the configured temperature for the selected zone(s) in the subset based on the input. For example, the furnace controller 138 decrements the configured temperature of the subset of the zones 136a-136p in response to selection of the zone decrement button 214.

After incrementing or decrementing the temperature for the subset of zones (block 408), or if input to modify the temperature has not been received (block 406), at block 410 the furnace controller 138 determines whether input to modify a temperature for predetermined zones. For example, the furnace controller 138 may monitor for inputs from the group configuration buttons 216-222. If input to modify a temperature for predetermined zones has been received (block 410), at block 412 the furnace controller selects zones and increments and/or decrements the temperature configuration for the selected zones based on the input. For example, selection of the increment lower zones button 218 selects the zones 136i-136p as the subset (e.g., removing any other previously selected zones from the subset) and increments the zones 136i-136p.

After selecting the zones and incrementing or decrementing the temperatures (block 412), or if input to modify the temperature for preselected zones has not been received (block 410), at block 414 the furnace controller 138 controls the firing furnace heating elements based on the temperatures of the zones 136a-136p. Control may then return to block 402.

The present methods and systems may be realized in hardware, software, and/or a combination of hardware and software. The present methods and/or systems may be realized in a centralized fashion in at least one computing system, or in a distributed fashion in which different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A furnace to fire photovoltaic cells, the furnace comprising:
    a plurality of zones comprising firing elements configured to fire a metallization layer of photovoltaic cells by heating the photovoltaic cells in the zones;
    one or more belts configured to transport photovoltaic cells through a sequence of the plurality of zones;
    a user interface comprising one or more input devices; and
    control circuitry configured to:
        control the firing elements for the plurality of zones;
        modify a configuration of two or more zones of the plurality of zones based on input received via the input device;
        receive a peak cell temperature via the one or more input devices; and
        modify the configuration of the two or more zones of the plurality of zones to achieve the peak cell temperature.

2. The furnace as defined in claim 1, wherein the user interface enables a selection of zones of the plurality of zones for inclusion in a subset of zones of the plurality of zones for modification.

3. The furnace as defined in claim 2, wherein the user interface enables a selection of a predetermined subset of the plurality of zones as the subset of zones of the plurality of zones for modification.

4. The furnace as defined in claim 2, wherein the user interface enables selection and deselection of individual ones of the plurality of zones for inclusion in the subset of zones of the plurality of zones for modification.

5. The furnace as defined in claim 1, wherein the control circuitry is configured to, in response to receiving an input via the user interface, increment or decrement a respective temperature setpoint for each zone of the plurality of zones included in a subset of zones of the plurality of zones for modification.

6. The furnace as defined in claim 1, wherein the control circuitry is configured to select a subset of zones of the plurality of zones and increment or decrement a respective temperature setpoint for each zone of the plurality of zones included in the subset of zones based on a single input from the user interface.

7. The furnace as defined in claim 1, wherein first zones of the plurality of zones are located on a first side of the one or more belts and second zones of the plurality of zones are located on a second side of the one or more belts.

8. The furnace as defined in claim 1, wherein the user interface comprises at least one of a hardware button, a software button, a display screen and cursor, or a touchscreen.

9. The furnace as defined in claim 1, wherein the plurality of zones correspond to respective volumes within a heating section of the furnace.

10. The furnace as defined in claim 1, wherein the user interface is configured to indicate which zones of the plurality of zones are currently included in a subset of zones of the plurality of zones for modification.

11. The furnace as defined in claim 1, wherein the user interface is configured to indicate at least one of a current temperature or a temperature setpoint for each zone of the plurality of zones.

* * * * *